US012739978B2

(12) United States Patent
Chu et al.

(10) Patent No.: US 12,739,978 B2
(45) Date of Patent: Sep. 15, 2026

(54) STRUCTURAL ENCLOSURE FOR PROTECTION AGAINST FOREIGN OBJECT DEBRIS AND RESTRAINT OF THERMAL INTERFACE MATERIAL

(71) Applicant: Raytheon Company, Tewksbury, MA (US)

(72) Inventors: Charles Chu, Temple City, CA (US); Bruce Vinttran, San Pedro, CA (US); Paola V. Lopez, Santa Fe Springs, CA (US); Sung H. Lee, Santa Clarita, CA (US); Keith R. Burrell, Rancho Palos Verdes, CA (US); Andrew J. Bristol, Brentwood, CA (US); Kevin A. Miyamoto, Camarillo, CA (US)

(73) Assignee: Raytheon Company, Arlington, VA (US)

( * ) Notice: Subject to any disclaimer, the term of this patent is extended or adjusted under 35 U.S.C. 154(b) by 329 days.

(21) Appl. No.: 18/529,859

(22) Filed: Dec. 5, 2023

(65) Prior Publication Data

US 2025/0185176 A1 Jun. 5, 2025

(51) Int. Cl.

*H05K 1/02* (2006.01)
*H05K 1/18* (2026.01)

(Continued)

(52) U.S. Cl.

CPC ........... *H05K 1/182* (2013.01); *H05K 1/0201* (2013.01); *H05K 13/04* (2013.01); *H05K 2201/062* (2013.01); *H05K 2201/0999* (2013.01)

(58) Field of Classification Search

CPC ........ H05K 1/0201; H05K 1/182; H05K 1/02; H05K 1/18; H05K 13/04; H05K 2201/062; H05K 2201/0999

(Continued)

(56) References Cited

U.S. PATENT DOCUMENTS 5,798,557 A 8/1998 Salatino et al.
6,292,362 B1 9/2001 O'Neal et al.

(Continued)

FOREIGN PATENT DOCUMENTS

CN 103258748 A 8/2013
CN 105655264 A 6/2016

(Continued)

OTHER PUBLICATIONS

Miyamoto et al., "Structural Enclosure for Protection Against Foreign Object Debris," U.S. Appl. No. 18/307,101, filed Apr. 26, 2023, 29 pages.

(Continued)

*Primary Examiner* — Timothy J Thompson
*Assistant Examiner* — Guillermo J Egoavil

(57) ABSTRACT

A system includes a substrate and an electrical component mounted to the substrate. The system also includes a structural enclosure positioned around lateral edges of the electrical component and mounted to the substrate. The structural enclosure includes raised walls extending away from the substrate and surrounding the electrical component. The raised walls are configured to block foreign object debris from the electrical component. The system further includes a lid connected to the substrate, where the lid covers the electrical component and the structural enclosure. The system also includes a seal positioned between the structural enclosure and the lid, where the seal is configured to be compressed when the lid is connected to the substrate. In addition, the system includes a thermal interface material positioned between and contacting the electrical component and the lid.

20 Claims, 6 Drawing Sheets

(51) Int. Cl.
*H05K 1/182* (2026.01)
*H05K 13/04* (2006.01)

(58) Field of Classification Search
USPC .......................................................... 361/760
See application file for complete search history.

(56) References Cited

U.S. PATENT DOCUMENTS

| | | | |
|---|---|---|---|
| 8,664,752 | B2 | 3/2014 | Jeon et al. |
| 9,508,623 | B2 | 11/2016 | Suthiwongsunthorn et al. |
| 9,957,154 | B2 | 5/2018 | Favier et al. |
| 10,971,421 | B1 | 4/2021 | He et al. |
| 11,264,264 | B2 | 3/2022 | Noma et al. |
| 2002/0041489 | A1 | 4/2002 | Fritz |
| 2007/0190747 | A1 | 8/2007 | Humpston et al. |
| 2008/0289766 | A1 | 11/2008 | Heemstra et al. |
| 2009/0146294 | A1 | 6/2009 | Hillman et al. |
| 2011/0080713 | A1 | 4/2011 | Sunohara |
| 2021/0305109 | A1* | 9/2021 | Uhlig .................... H10W 42/00 |

FOREIGN PATENT DOCUMENTS

| | | | |
|---|---|---|---|
| CN | 107378761 | A | 11/2017 |
| JP | 2012-222331 | A | 11/2012 |

OTHER PUBLICATIONS

Xilinx, “RT Kintex UltraScale FPGAs for Ultra High Throughput and High Bandwidth Applications,” WP523 (v1.0), May 2020, 17 pages.

Xilinx, “Radiation Tolerant Kintex UltraScale XQRKU060 FPGA Data Sheet,” Product Specification, DS882 (v1.3), Apr. 2022, 101 pages.

Non-Final Office Action dated May 4, 2026 in connection with U.S. Appl. No. 18/307,101, 27 pages.

* cited by examiner

STRUCTURAL ENCLOSURE FOR PROTECTION AGAINST FOREIGN OBJECT DEBRIS AND RESTRAINT OF THERMAL INTERFACE MATERIAL

GOVERNMENT RIGHTS

This invention was made with government support. The government has certain rights in the invention.

TECHNICAL FIELD

This disclosure relates generally to electronic systems. More specifically, this disclosure relates to a structural enclosure for protection against foreign object debris and restraint of thermal interface material.

BACKGROUND

Electronic devices routinely include processors or other electrical components that are mounted to printed circuit boards. The mounting of a processor or other electrical component to a printed circuit board may be accomplished in various ways. Often times, the mounting techniques involve the use of conductive structures that form electrical connections between the processor or other electrical component and electrical traces or other conductive structures on the printed circuit board.

SUMMARY

This disclosure relates to a structural enclosure for protection against foreign object debris and restraint of thermal interface material.

In a first embodiment, a system includes a substrate and an electrical component mounted to the substrate. The system also includes a structural enclosure positioned around lateral edges of the electrical component and mounted to the substrate. The structural enclosure includes raised walls extending away from the substrate and surrounding the electrical component. The raised walls are configured to block foreign object debris from the electrical component. The system further includes a lid connected to the substrate, where the lid covers the electrical component and the structural enclosure. The system also includes a seal positioned between the structural enclosure and the lid, where the seal is configured to be compressed when the lid is connected to the substrate. In addition, the system includes a thermal interface material positioned between and contacting the electrical component and the lid.

In a second embodiment, a method includes obtaining an electrical component mounted to a substrate. The method also includes attaching a structural enclosure to the substrate such that the structural enclosure is positioned around lateral edges of the electrical component. The structural enclosure includes raised walls extending away from the substrate and surrounding the electrical component, where the raised walls are configured to block foreign object debris from the electrical component. The method further includes placing a thermal interface material over the electrical component and placing a seal over the structural enclosure. In addition, the method includes connecting a lid to the substrate, where the lid covers the electrical component and the structural enclosure. The seal is compressed when the lid is connected to the substrate.

In a third embodiment, an apparatus includes a structural enclosure configured to be mounted to a substrate and positioned around lateral edges of an electrical component mounted to the substrate. The structural enclosure includes raised walls configured to surround the electrical component, where the raised walls are configured to block foreign object debris from the electrical component. The raised walls include or are configured to cooperate with a groove configured to receive a portion of a seal.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
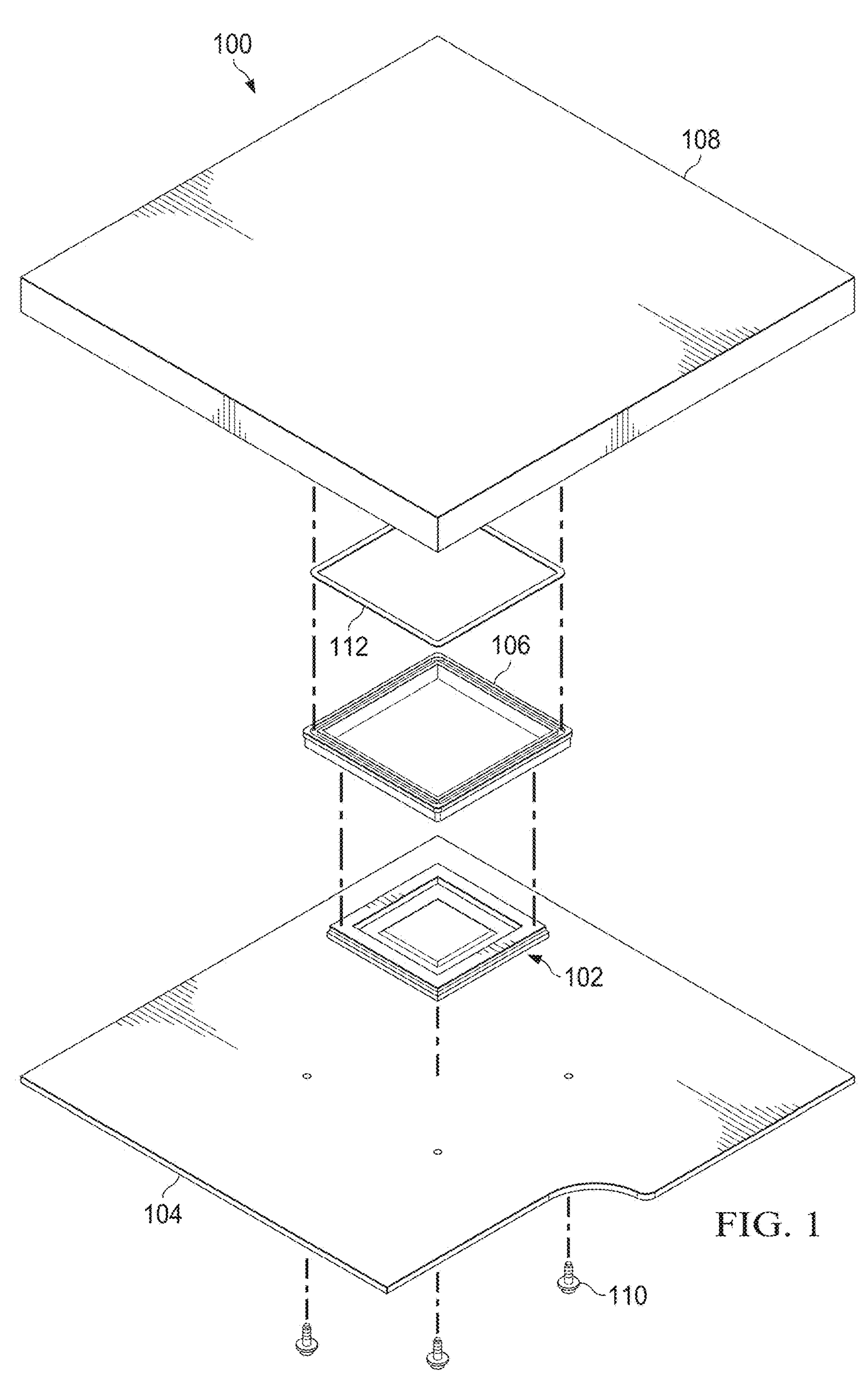
FIGS. 1 through 4 illustrate an example system that includes a structural enclosure for protection against foreign object debris and restraint of thermal interface material according to this disclosure.

FIGS. 1 through 6, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, electronic devices routinely include processors or other electrical components that are mounted to printed circuit boards. The mounting of a processor or other electrical component to a printed circuit board may be accomplished in various ways. Often times, the mounting techniques involve the use of conductive structures that form electrical connections between the processor or other electrical component and electrical traces or other conductive structures on the printed circuit board.

Unfortunately, the conductive structures used to electrically couple the processors or other electrical components to the printed circuit boards can suffer from various problems related to random objects or materials (often referred to as foreign object debris) that inadvertently contact one or more of the conductive structures. If the foreign object debris is itself electrically conductive and the processors or other electrical components are powered on, the foreign object debris may create short-circuits, cause damage to the processors or other electrical components, or create other problems with the processors or other electrical components.

Moreover, some processors or other electrical components are used with thermal interface materials (TIMs), which represent materials that can be placed between objects to enhance the transfer of thermal energy between the objects. The thermal interface materials help to transport thermal energy away from the processors or other electrical components, which can help to reduce or prevent the processors or other electrical components from overheating. There are various types of non-solidified thermal interface materials that are available for use, such as putties, pastes, gels, waxes, and greases. While these thermal interface materials are effective, they generally cannot be used when external environmental loads (such as heat, vibrations, or shock) allow the thermal interface materials to migrate (such as due to pump out, shear flow, or bulk migration). Migration of a thermal interface material can create a break in a cooling path, resulting in the failure of a processor or other electrical component. While thermal interface materials in the form of sheets are available, they often require consistent pressure over the entire lifetime of their use. While solidified thermal interface materials (such a epoxies) are also available, they typically create difficult reworking issues since the solidified thermal interface materials cannot be easily removed.

This disclosure provides a structural enclosure for protection against foreign object debris and restraint of thermal interface material. As described in more detail below, a structural enclosure can be sized to fit around a processor or other electrical component, and the structural enclosure can be mounted to a printed circuit board or other substrate to which the processor or other electrical component is or will be mounted. The structural enclosure can be fabricated from one or more electrically conductive materials or non-electrically conductive materials, such as one or more plastics or metals. In some cases, the structural enclosure may be installed on a printed circuit board or other substrate after the processor or other electrical component is installed on the printed circuit board or other substrate. In some cases, walls of the structural enclosure include a groove that is configured to receive a gasket or other seal, and a thermal interface material can be placed on the processor or other electrical component after mounting to the printed circuit board or other substrate.

A lid can be placed over the processor or other electrical component and the structural enclosure, and the lid can be secured to the printed circuit board or other substrate while compressing the gasket or other seal. This allows the structural enclosure and the lid to act as a barrier between the processor or other electrical component and foreign object debris. Moreover, this allows the structural enclosure and the lid to help restrain the thermal interface material from migrating out of a position where the thermal interface material can be used to remove thermal energy from the processor or other electrical component. In some cases, epoxy or other material(s) may be used to fill one or more gaps around a base of the structural enclosure. Also, in some cases, the structural enclosure and the lid may optionally be formed using at least one radiation-hardened or radiation-tolerant material, such as through appropriate material selection for the structural enclosure. This can help to provide radiation protection for the processor or other electrical component, which may itself represent a radiation-hardened or radiation-tolerant component.

Depending on the implementation, the structural enclosure may require little if any additional area on a printed circuit board or other substrate beyond the area that is already available. This can be a useful or desirable feature in some applications, such as when size and weight are important factors. Also, the structural enclosure may be fabricated from one or more materials that are pre-qualified or pre-approved for use in certain applications or environments like in space-based or other applications, and the structural enclosure may be fabricated using common techniques like three-dimensional (3D) printing or other techniques. As a result, there may be little or no need to undergo qualification of new materials and new machining or other processes in order to fabricate and use the structural enclosure. Further, the structural enclosure can provide protection against foreign object debris without affecting the integrity of conductive connectors used to couple the processor or other electronic device to the printed circuit board or other substrate. In addition, the use of the gasket or other seal and the lid can help to reduce or prevent migration of the thermal interface material in a manner that could break a thermal pathway needed for thermal management of the processor or other electronic device. This can be useful or desirable in applications in which an overall system is subjected to shear loads, such as shear loads due to vibrations, shock, large thermal cycles, or other causes.

Figure 2:
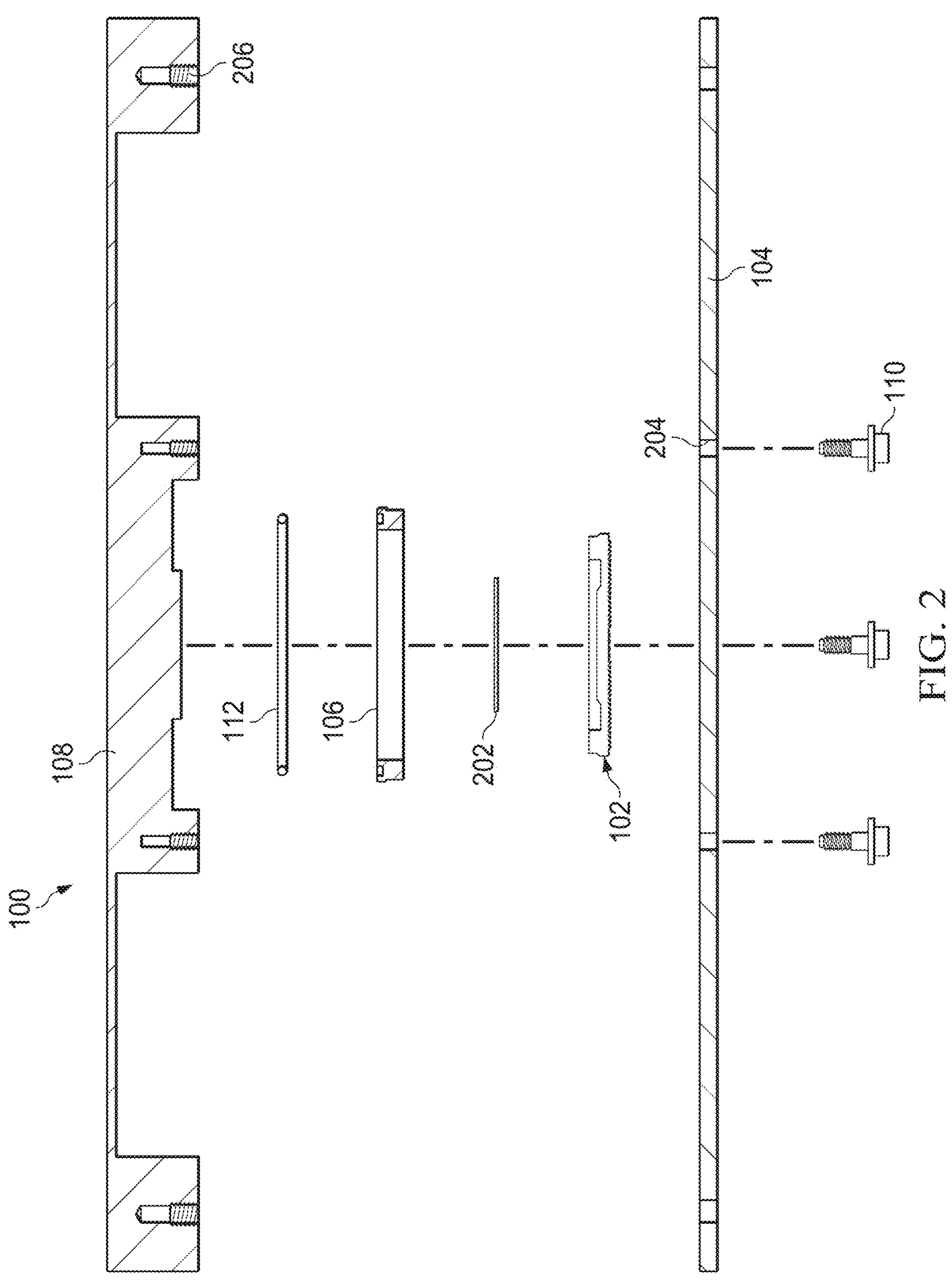
Figure 3:
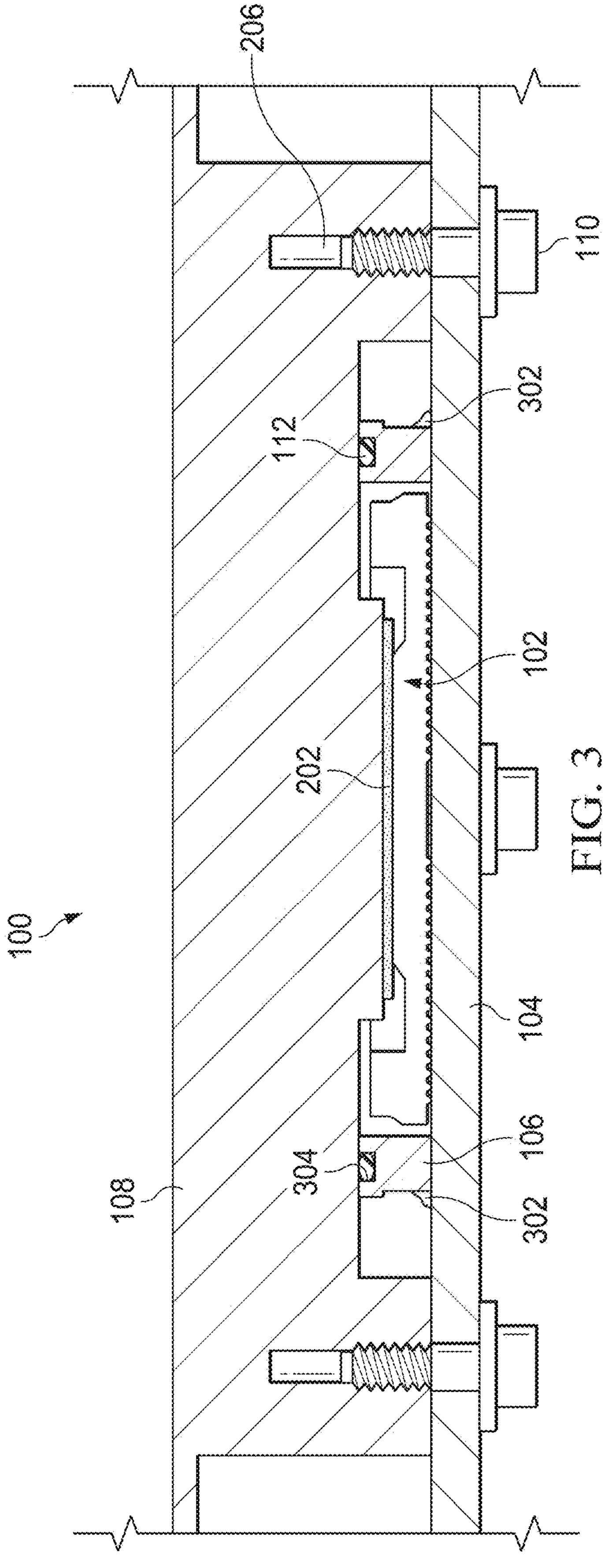
Figure 4:
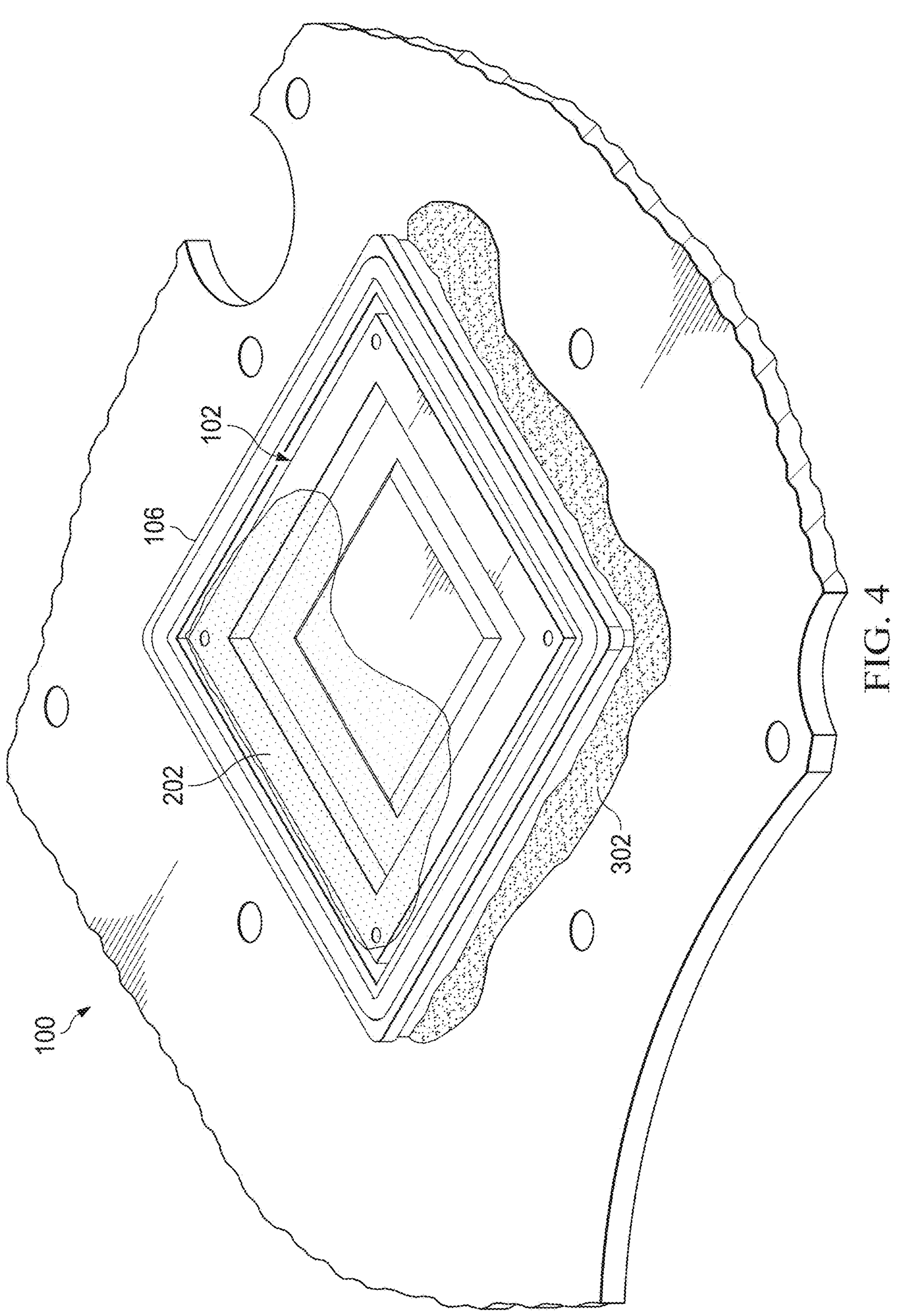

FIGS. 1 through 4 illustrate an example system 100 that includes a structural enclosure for protection against foreign object debris and restraint of thermal interface material according to this disclosure. More specifically, FIG. 1 illustrates an example exploded perspective view of the system 100, FIG. 2 illustrates an example exploded cross-sectional view of the system 100, FIG. 3 illustrates an example assembled cross-sectional view of the system 100, and FIG. 4 illustrates an example partial assembled perspective view of the system 100.

As shown in FIGS. 1 through 4, the system 100 includes an electrical component 102, which in some examples may take the form of a processor. The electrical component 102 may have any suitable form factor. For instance, in some cases, a processor used as the electrical component 102 may typically have a square or rectangular cross-section along a horizontal plane through the electrical component 102 and a rectangular cross-section along a vertical plane through the electrical component 102. Also, the size of the electrical component 102 may vary depending on the application. As a particular example, the electrical component 102 may represent a processor having a size of about 42 millimeters by about 42 millimeters. However, the electrical component 102 can have any suitable size, shape, and dimensions. Note that while the electrical component 102 is often described as representing a processor, any other suitable electrical component 102 may be used here.

The electrical component 102 is mounted to an underlying substrate 104, which in this example takes the form of a printed circuit board. For example, conductive connectors of the electrical component 102 (such as a ball grid array) may be placed on the surface of the underlying substrate 104 and used to secure the electrical component 102 to the underlying substrate 104. This can help to couple electrical traces or other conductive structures of the underlying substrate 104 to the electrical component 102, thereby providing electrical pathways between the electrical component 102 and the conductive structures of the underlying substrate 104. The underlying substrate 104 represents any suitable structure on or to which at least the electrical component 102 can be mounted. Note that while the underlying substrate 104 is often described as representing a printed circuit board, any other suitable substrate 104 may be used here.

A structural enclosure 106 is used with the electrical component 102 in order to protect the conductive connectors and other portions of the electrical component 102 from foreign object debris. The structural enclosure 106 is sized to fit around the electrical component 102 and helps to protect the electrical component 102. In some cases, however, the structural enclosure 106 may not actually contact the electrical component 102 and can remain spaced apart from the electrical component 102. The structural enclosure 106 can also be mounted to the underlying substrate 104 in order to hold the structural enclosure 106 in place. The structural enclosure 106 can be mounted to the underlying substrate 104 in any suitable manner, such as via edge bonding using appropriate material(s) like epoxy. In some embodiments, the structural enclosure 106 can be mounted to the underlying substrate 104 after the electrical component 102 has been mounted to the underlying substrate 104. Among other things, this may allow for functional verification of a circuit card assembly or other assembly that includes the electrical component 102 and the underlying substrate 104 with or without the structural enclosure 106.

The structural enclosure 106 may be fabricated using any suitable material or materials. For example, in some embodiments, the structural enclosure 106 may be fabricated using one or more non-electrically conductive materials, such as one or more plastics like acrylonitrile butadiene styrene (ABS) plastic. In other embodiments, the structural enclosure 106 may be fabricated using one or more electrically conductive materials, such as one or more metals. Moreover, the structural enclosure 106 may or may not be fabricated using one or more radiation-hardened or radiation-tolerant materials. In addition, in some cases, the structural enclosure 106 may be fabricated using one or more materials that are pre-qualified or pre-approved for use in at least one specified application or environment, such as when the structural enclosure 106 is fabricated using one or more materials that are pre-qualified for use in space-based applications. One specific example of such a pre-qualified material for use in space-based applications is ABS-ESD7 fused deposition modeling (FDM) thermoplastic available from STRATASYS, LTD.

The structural enclosure 106 may also be fabricated in any suitable manner. For example, in some embodiments, the structural enclosure 106 may be fabricated using 3D printing or other additive manufacturing technique. In other embodiments, the structural enclosure 106 may be fabricated using computer numerical controlled (CNC) machining or other subtractive manufacturing technique. In still other embodiments, the structural enclosure 106 may be fabricated using injection molding. However the structural enclosure 106 is fabricated, in some cases, the structural enclosure 106 may have a form that closely matches the form of the electrical component 102 being protected (at least to within a specified tolerance), which allows the structural enclosure 106 to fit closely around the electrical component 102. Also, in some cases, there may be no need to undergo qualification of new materials and new machining or other processes in order to fabricate and use the structural enclosure 106.

As can be seen in FIGS. 1 through 4, the structural enclosure 106 is positioned around and provides protection along the lateral sides of the electrical component 102. Among other things, the structural enclosure 106 helps to prevent ingress of foreign object debris, thereby helping to reduce the likelihood of a short-circuit, damage, or other problems occurring as a result of the foreign object debris. In some cases, the structural enclosure 106 here may require little if any additional area on the printed circuit board or other underlying substrate 104 beyond the area that is already available. Among other reasons, this may be due to the existence of a standard assembly "keep out" zone around the electrical component 102, which refers to a zone around the electrical component 102 in which other electrically-active components may not be positioned. The ability to use existing space on the underlying substrate 104 may be useful or desirable in various applications, such as space-based applications or other applications in which reducing or minimizing size and weight is needed or desired. Moreover, the structural enclosure 106 can provide protection against foreign object debris without affecting the integrity of the conductive connectors that couple the electrical component 102 and the substrate 104. This is because the structural enclosure 106 sits around the electrical component 102 and does not require the buildup of any materials around the conductive connectors themselves. In some cases, the structural enclosure 106 may further provide structural reinforcement for the electrical component 102 itself, which may increase the structural loading capabilities of the electrical component 102.

Note that while space-based applications have been mentioned specifically above as one type of example usage of the structural enclosure 106, the structural enclosure 106 may be used in any suitable applications in any suitable environments. This can include various terrestrial, seaborne, airborne, and space-based applications in which at least one processor or other electrical component 102 is mounted to at least one printed circuit board or other underlying substrate 104. The structural enclosure 106 may also be used with any suitable electrical components 102, such as high-performance processors or other high-performance electronics.

As shown in FIGS. 1 through 3, the structural enclosure 106 is used in conjunction with a lid 108, which can be secured to the substrate 104 using various connectors 110. A seal 112 is positioned between the structural enclosure 106 and the lid 108, and the seal 112 can be compressed when the lid 108 is secured to the substrate 104. The lid 108 may be used to cover the electrical component 102, such as to help provide protection for the electrical component 102. The lid 108 may also be used for other or additional purposes. For example, the lid 108 may be used to help facilitate cooling of the electrical component 102, such as by removing thermal energy from the electrical component 102 and allowing the thermal energy to be removed from the lid 108 (possibly via a heat strap or other conductive thermal transfer mechanism or via radiation or convection). In some cases, the lid 108 may be formed using at least one radiation-hardened or radiation-tolerant material, which can help to provide radiation protection for the electrical component 102 (which itself may be radiation-hardened or radiation-tolerant). Note that any suitable connectors 110 may be used to secure the lid 108 to the substrate 104, such as bolts or screws. The seal 112 represents any suitable structure configured to be compressed and to help prevent movement of material between the structural enclosure 106 and the lid 108, such as a gasket. In some cases, the seal 112 may represent a space flight-approved gasket.

FIGS. 2 through 4 illustrate that a thermal interface material 202 can be placed over the electrical component 102 and within the structural enclosure 106. The thermal interface material 202 represents at least one thermally-conductive material that helps to remove thermal energy from the electrical component 102 and provide the thermal energy to the lid 108. In some cases, the thermal interface material 202 can represent a non-solidified thermal interface material, such as a putty, paste, gel, wax, or grease. Because certain environments can subject the system 100 to large external environmental loads like heat, vibrations, or shock, a non-solidified thermal interface material 202 has the ability to migrate or move, which can be undesirable if the thermal interface material 202 moves and breaks a thermal pathway between the electrical component 102 and the lid 108. However, the presence of the structural enclosure 106 and the lid 108 (as well as the seal 112 between the two) can help to keep the thermal interface material 202 within the space between the electrical component 102 and the lid 108.

In this way, the thermal interface material 202 can be maintained in a position that allows thermal energy to be transferred effectively between the electrical component 102 and the lid 108. This may be useful or important in various implementations, such as when topside cooling represents the primary cooling mechanism for cooling the electrical component 102. In some cases, for example, up to seventy percent or more of the thermal energy generated by the electrical component 102 may be removed from the top of the electrical component 102 via the thermal interface material 202 and the lid 108. As a result, maintaining the thermal interface material 202 between the electrical component 102 and the lid 108 can help to ensure that this primary cooling mechanism remains functional over the operational lifetime of the system 100, even in the presence of large external environmental loads. Moreover, because the lid 108 can be removably attached to the substrate 104 using the connectors 110, it is much easier for personnel to engage in reworking operations involving the electrical component 102 since the lid 108 can be removed and the thermal interface material 202 can be removed or replaced.

In FIG. 2, it can be seen that the substrate 104 may include various openings 204 that allow the connectors 110 to pass through the substrate 104 and into threaded or other openings 206 of the lid 108. This represents one example way in which the lid 108 can be removably attached to the substrate 104. However, the lid 108 may be removably attached to the substrate 104 or permanently attached to the substrate 104 in any other suitable manner. In FIGS. 3 and 4, one or more gaps along the bottom edge(s) of the structural enclosure 106 may optionally be sealed or otherwise at least partially blocked. For example, a material 302 may be deposited along the bottom edge(s) of the structural enclosure 106 in order to reduce or prevent the ability of foreign object debris to pass under the structural enclosure 106. The material 302 may also or alternatively prevent the thermal interface material 202 from migrating under the structural enclosure 106 and away from the electrical component 102. Any suitable material 302 may be used here, such as epoxy or edge bonding material. Note, however, that the use of the material 302 may not be needed in some embodiments, such as when the structural enclosure 106 can be sealed to the substrate 104 during attachment of the structural enclosure 106 to the substrate 104.

As can be seen here, the structural enclosure 106 is formed using raised walls, where each wall represents a portion of the structural enclosure 106 that is attached along its bottom edge to the underlying substrate 104 and that extends upward around at least part of the electrical component 102. In this particular example, the structural enclosure 106 includes four raised walls forming a square. However, the number of raised walls and the shape formed by the raised walls can vary, such as depending on the size and shape of the electrical component 102 being protected. As shown in FIG. 3, the raised walls of the structural enclosure 106 need not have a uniform thickness, such as when upper portions of the raised walls of the structural enclosure 106 are thicker than lower portions of the raised walls. Each raised wall can include a groove 304, and the groove 304 can be configured to receive at least part of the seal 112, which helps to hold the seal 112 in place. While the groove 304 is FIG. 3 is shown as being generally square or rectangular, the groove 304 may have any other suitable form. Also, while the groove 304 is shown here as being positioned in the raised walls of the structural enclosure 106, a groove may also or alternatively be positioned in the lid 108 over the raised walls of the structural enclosure 106, in which case the raised walls of the structural enclosure 106 may cooperate with the groove in the lid 108 (which itself is configured to receive a portion of the seal 112).

Figure 5:
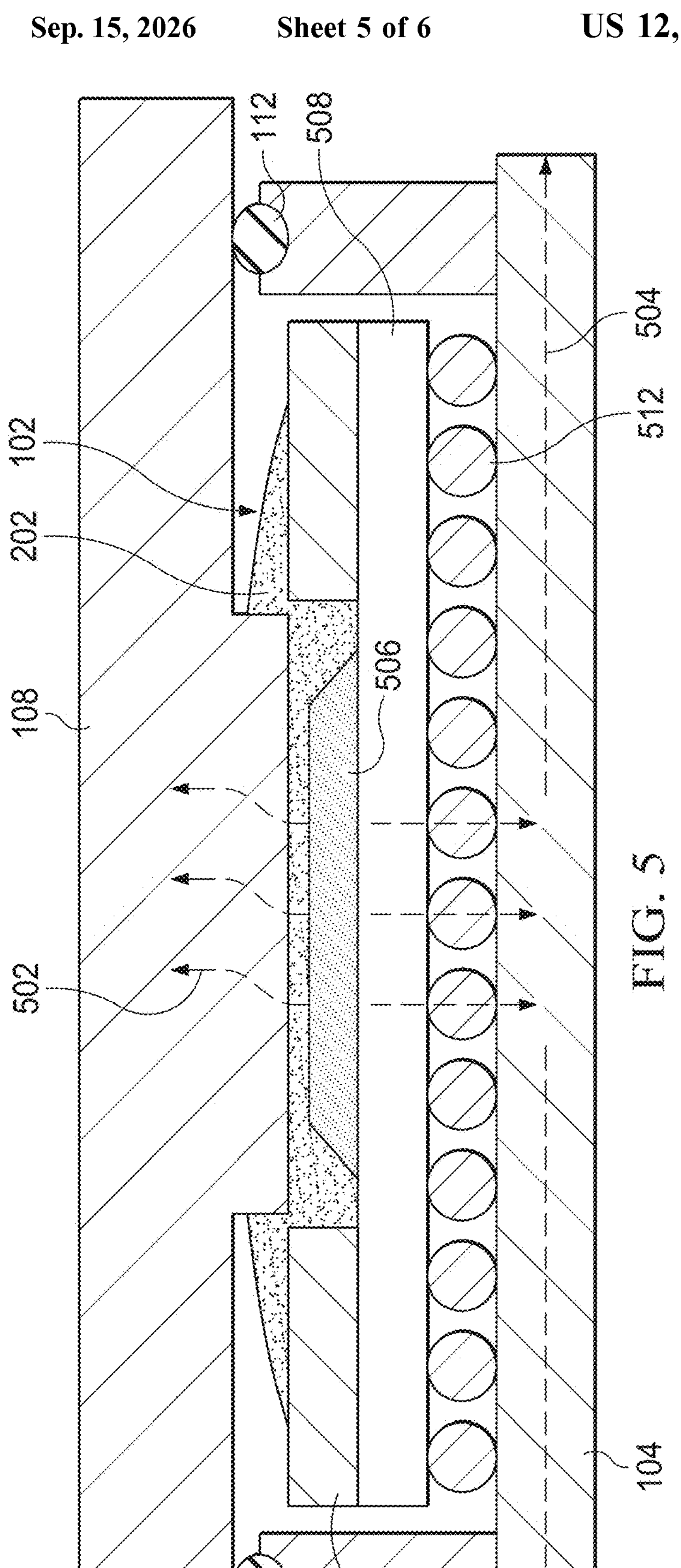
FIG. 5 illustrates example thermal pathways in a system that includes a structural enclosure for protection against foreign object debris and restraint of thermal interface material according to this disclosure.

FIG. 5 illustrates example thermal pathways in the system 100 that includes the structural enclosure 106 for protection against foreign object debris and restraint of thermal interface material 202 according to this disclosure. As shown in FIG. 5, a primary thermal pathway 502 from the electrical component 102 can pass through the thermal interface material 202 and into the lid 108. The structural enclosure 106 here can help to prevent migration of the thermal interface material 202 away from the space between the electrical component 102 and the lid 108. Effectively, the structural enclosure 106 can function as a berm that maintains the bulk of the thermal interface material 202 in a desired position where the primary thermal pathway 502 is desired. Note that a secondary thermal pathway 504 may also exist between the electrical component 102 and the substrate 104, although this secondary thermal pathway 504 may be capable of transporting a smaller amount of thermal energy. Also note that the cross-sectional shape of the raised walls of the structural enclosure 106 here is different than in FIG. 3. In FIG. 5, the raised walls of the structural enclosure 106 have a uniform thickness, which still allows the groove 304 to be formed in the raised walls for retaining the seal 112 and/or allows the seal 112 to be placed over the raised walls of the structural enclosure 106.

A specific example embodiment of the electrical component 102 is also shown in FIG. 5. In this example, the electrical component 102 includes a semiconductor die 506 mounted on its own substrate 508. The semiconductor die 506 can represent any suitable processing device, such as a microprocessor, microcontroller, digital signal processor (DSP), application specific integrated circuit (ASIC), or field programmable gate array (FPGA), or other semiconductor device. The substrate 508 may represent a relatively small printed circuit board or other substrate configured to carry the semiconductor die 506. A stiffener ring 510 can be positioned around the semiconductor die 506 and mounted on the substrate 508, where the stiffener ring 510 can provide structural support for the electrical component 10.

Conductive connectors 512 can be used to electrically couple the electrical component 102 to the substrate 104. For example, the conductive connectors 512 may be mounted on the substrate 104 in order to electrically couple the semiconductor die 506 to electrical traces or other conductive structures on the substrate 104. The conductive connectors 512 enable electrical signals to be transported to and from the electrical component 102 during operation of the electrical component 102. For example, the conductive connectors 512 may be used to provide electrical power to the electrical component 102, such as electrical power from a battery, power adapter, solar cell, or other power source. The conductive connectors 512 may also be used to provide information to or receive information from the electrical component 102. The conductive connectors 512 may be formed from any suitable material(s), such as one or more metals like solder. The conductive connectors 512 may also have any suitable form, such as when the conductive connectors 512 represent a ball grid array. There may be any suitable number of conductive connectors 512 used with the electrical component 102, which can depend on (among other things) the size and capabilities of the electrical component 102. As a particular example, the electrical component 102 may have multiple hundreds of conductive connectors 512 or more in a ball grid array or other array.

Although FIGS. 1 through 4 illustrate one example of a system 100 that includes a structural enclosure 106 for protection against foreign object debris and restraint of thermal interface material 202, various changes may be made to FIGS. 1 through 4. For example, various components shown in FIGS. 1 through 4 may be combined, further subdivided, replicated, omitted, or rearranged and additional components may be added according to particular needs. Thus, the system 100 may include any suitable number of each component shown in FIGS. 1 through 4, and those components may be arranged in any suitable manner. Also, the size, shape, and dimensions of each component shown in FIGS. 1 through 4 are examples only and can vary as needed or desired. In addition, while FIGS. 1 through 4 illustrates one example environment in which one or more structural enclosures 106 may be used to provide protection against foreign object debris and restraint of thermal interface material 202, the structural enclosures 106 may be used in any other suitable environments. Although FIG. 5 illustrates one example of thermal pathways in a system 100 that includes a structural enclosure 106 for protection against foreign object debris and restraint of thermal interface material 202, various changes may be made to FIG. 5. For instance, the system 100 may include any suitable number of thermal pathways. Also, the electrical component 102 may have any other suitable form and is not limited to the specific design shown in FIG. 5. Finally, note that the views shown in FIGS. 1 through 5 are not to scale.

Figure 6:
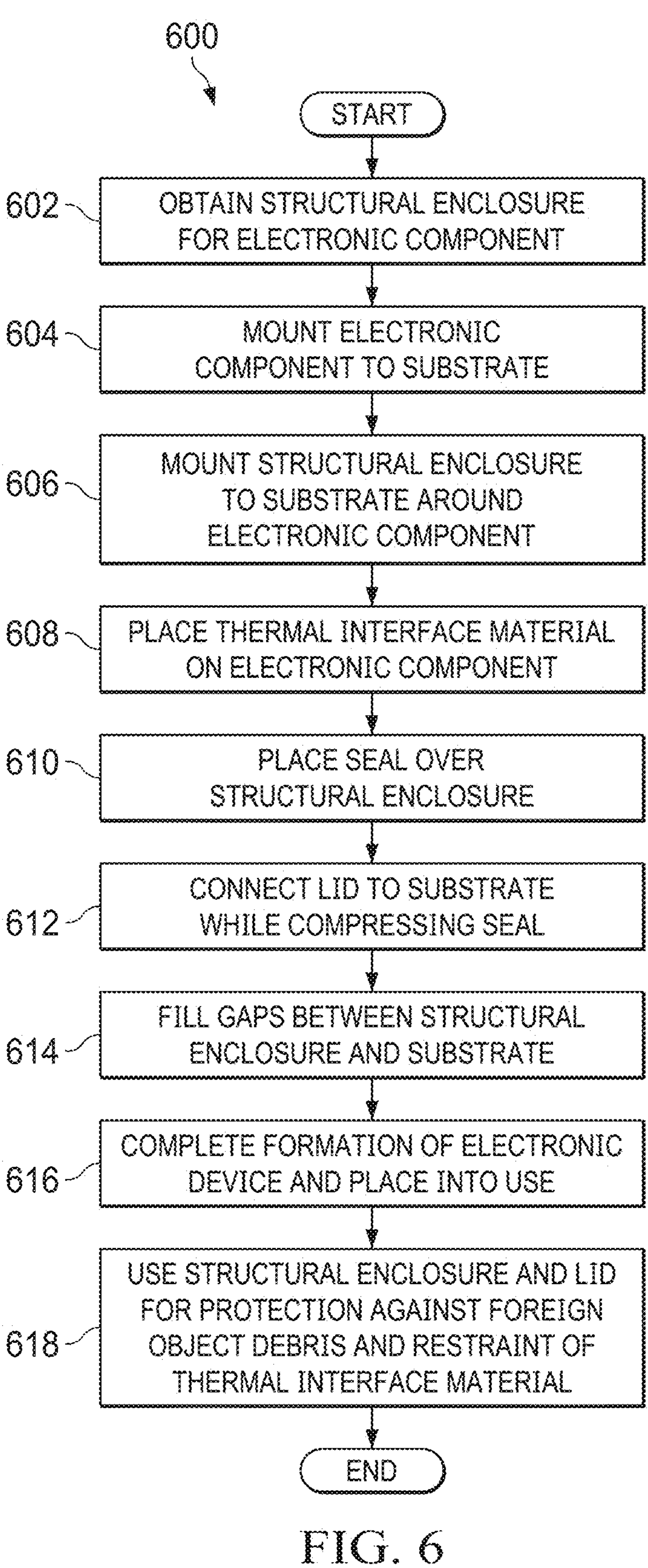
FIG. 6 illustrates an example method for using a structural enclosure for protection against foreign object debris and restraint of thermal interface material according to this disclosure.

FIG. 6 illustrates an example method 600 for using a structural enclosure for protection against foreign object debris and restraint of thermal interface material according to this disclosure. For case of explanation, the method 600 is described as involving the use of the structural enclosure 106 with the electrical component 102 within the system 100 shown in FIGS. 1 through 5. However, the structural enclosure 106 may be used with any other suitable electrical component(s) and in any other suitable system(s).

As shown in FIG. 6, a structural enclosure for an electrical component is obtained at step 602. This may include, for example, fabricating or otherwise obtaining a structural enclosure 106 that is designed for use with at least one specified electrical component 102. As noted above, in some cases, the structural enclosure 106 can have a size, shape, and dimensions that allow the structural enclosure 106 to surround and protect the specified electrical component 102. Often times, the structural enclosure 106 will closely follow the outer edges or lateral sides of the electrical component 102, at least to within some desired tolerance.

The electrical component is mounted to a substrate at step 604. This may include, for example, mounting the electrical component 102 to a printed circuit board or other underlying substrate 104 using the conductive connectors 512 of the electrical component 102. In some embodiments, for instance, the conductive connectors 512 may be surface-mounted to the printed circuit board or other underlying substrate 104 in order to secure the electrical component 102 to the underlying substrate 104. The structural enclosure is mounted to the substrate at step 606. This may include, for example, mounting the structural enclosure 106 to the printed circuit board or other underlying substrate 104 so that the structural enclosure 106 surrounds the electrical component 102. In some embodiments, for instance, the structural enclosure 106 may be mounted to the printed circuit board or other underlying substrate 104 using edge bonding or other technique. A thermal interface material is placed on the electrical component at step 608. This may include, for example, depositing the thermal interface material 202 on top of the electrical component 102 and within the structural enclosure 106.

A seal is positioned over the structural enclosure at step 610, and a lid is attached to the substrate while compressing the seal at step 612. This may include, for example, placing the seal 112 within the groove(s) 304 of the raised wall(s) of the structural enclosure 106. As noted above, the groove(s) 304 may also or alternatively be formed in the lid 108. This may also include placing the lid 108 over the electrical component 102 and the structural enclosure 106 and attaching the lid 108 to the substrate 104 using the connectors 110. This causes the lid 108 to compress the seal 112 that is positioned within the groove(s) 304. Any gaps between the structural enclosure and the substrate may be filled at step 614. This may include, for example, depositing material 302 along the base of the structural enclosure 106 in order to fill any gaps between the structural enclosure 106 and the substrate 104. Note, however, that this step is optional if gap filling is not needed or desired.

Formation of an electronic device may be completed and the device may be placed into use at step 616, and the structural enclosure and the lid can be used to provide protection against foreign object debris at step 618. This may include, for example, performing integration or other operations to incorporate the electrical component 102 and the underlying substrate 104 into a larger device or system. This may also include the structural enclosure 106 and the lid 108 limiting or preventing foreign object debris from contacting at least the conductive connectors 512 of the electrical component 102 during the subsequent integration or use operations involving the electrical component 102. This may further include the structural enclosure 106 and the lid 108 limiting or preventing the thermal interface material 202 from migrating away from the electrical component 102 to a significant extent.

Although FIG. 6 illustrates one example of a method 600 for using a structural enclosure for protection against foreign object debris and restraint of thermal interface material 222, various changes may be made to FIG. 6. For example, while shown as a series of steps, various steps in FIG. 6 may overlap, occur in parallel, occur in a different order, or occur any number of times (including zero times).

The following describes example embodiments of this disclosure that implement or relate to a structural enclosure for protection against foreign object debris and restraint of thermal interface material. However, other embodiments may be used in accordance with the teachings of this disclosure.

In a first embodiment, a system includes a substrate and an electrical component mounted to the substrate. The system also includes a structural enclosure positioned around lateral edges of the electrical component and mounted to the substrate. The structural enclosure includes raised walls extending away from the substrate and surrounding the electrical component. The raised walls are configured to block foreign object debris from the electrical component. The system further includes a lid connected to the substrate, where the lid covers the electrical component and the structural enclosure. The system also includes a seal positioned between the structural enclosure and the lid, where the seal is configured to be compressed when the lid is connected to the substrate. In addition, the system includes a thermal interface material positioned between and contacting the electrical component and the lid.

Any single one or any suitable combination of the following features may be used with the first embodiment. The structural enclosure, the lid, and the seal may be configured to retain at least some of the thermal interface material in a space between the electrical component and the lid. The electrical component may include a semiconductor die and multiple conductive connectors electrically connecting the semiconductor die to the substrate. The raised walls may be configured to block the foreign object debris from at least the conductive connectors of the electrical component. The raised walls may include a groove configured to receive a portion of the seal. Each of the raised walls may have a non-uniform thickness such that an upper portion of each raised wall is thicker than a lower portion of the raised wall. The system may also include a material at least partially filling one or more gaps between the structural enclosure and the substrate. The structural enclosure may include a 3D printed structure. The structural enclosure may remain spaced apart from the electrical component and may not contact the electrical component. The electrical component may include a semiconductor die and a ball grid array, and the substrate may include a printed circuit board. The ball grid array may be surface-mounted to a surface of the printed circuit board, and the structural enclosure may be attached to the surface of the printed circuit board.

In a second embodiment, a method includes obtaining an electrical component mounted to a substrate. The method also includes attaching a structural enclosure to the substrate such that the structural enclosure is positioned around lateral edges of the electrical component. The structural enclosure includes raised walls extending away from the substrate and surrounding the electrical component, where the raised walls are configured to block foreign object debris from the electrical component. The method further includes placing a thermal interface material over the electrical component and placing a seal over the structural enclosure. In addition, the method includes connecting a lid to the substrate, where the lid covers the electrical component and the structural enclosure. The seal is compressed when the lid is connected to the substrate.

Any single one or any suitable combination of the following features may be used with the second embodiment. The structural enclosure, the lid, and the seal may retain at least some of the thermal interface material in a space between the electrical component and the lid. The electrical component may include a semiconductor die and multiple conductive connectors electrically connecting the semiconductor die to the substrate. The raised walls may be configured to block the foreign object debris from at least the conductive connectors of the electrical component. The raised walls may include a groove that receives a portion of the seal. Each of the raised walls may have a non-uniform thickness such that an upper portion of each raised wall is thicker than a lower portion of the raised wall. The method may also include using a material to at least partially fill one or more gaps between the structural enclosure and the substrate. The structural enclosure may include a 3D printed structure. The structural enclosure may remain spaced apart from the electrical component and may not contact the electrical component. The electrical component may include a semiconductor die and a ball grid array, and the substrate may include a printed circuit board. The ball grid array may be surface-mounted to a surface of the printed circuit board, and the structural enclosure may be attached to the surface of the printed circuit board.

In a third embodiment, an apparatus includes a structural enclosure configured to be mounted to a substrate and positioned around lateral edges of an electrical component mounted to the substrate. The structural enclosure includes raised walls configured to surround the electrical component, where the raised walls are configured to block foreign object debris from the electrical component. The raised walls include a groove configured to receive a portion of a seal.

Any single one or any suitable combination of the following features may be used with the third embodiment. The structural enclosure may be configured to retain at least some of a thermal interface material in a space between the electrical component and a lid positioned over the structural enclosure and the electrical component. The raised walls may be configured to block the foreign object debris from at least conductive connectors of the electrical component. Each of the raised walls may have a non-uniform thickness such that an upper portion of each raised wall is thicker than a lower portion of the raised wall. The structural enclosure may include a 3D printed structure.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:

a substrate;

an electrical component mounted to the substrate;

a structural enclosure positioned around lateral edges of the electrical component and mounted to the substrate, the structural enclosure comprising raised walls extending away from the substrate and surrounding the electrical component, the raised walls configured to block foreign object debris from the electrical component;

a lid connected to the substrate, the lid covering the electrical component and the structural enclosure;

a seal positioned between the structural enclosure and the lid, the seal configured to be compressed when the lid is connected to the substrate; and a thermal interface material positioned between and contacting the electrical component and the lid;

wherein the structural enclosure, the lid, and the seal are configured to retain at least some of the thermal interface material in a space between the electrical component and the lid.

2. The system of claim 1, wherein:

the electrical component comprises a semiconductor die and multiple conductive connectors electrically connecting the semiconductor die to the substrate; and the raised walls are configured to block the foreign object debris from at least the conductive connectors of the electrical component.

3. The system of claim 1, wherein the raised walls comprise a groove configured to receive a portion of the seal.

4. The system of claim 3, wherein each of the raised walls has a non-uniform thickness such that an upper portion of each raised wall is thicker than a lower portion of the raised wall.

5. The system of claim 1, further comprising:

a material at least partially filling one or more gaps between the structural enclosure and the substrate.

6. The system of claim 1, wherein the structural enclosure comprises a three-dimensional (3D) printed structure.

7. The system of claim 1, wherein the structural enclosure remains spaced apart from the electrical component and does not contact the electrical component.

8. The system of claim 1, wherein:

the electrical component comprises a semiconductor die and a ball grid array;

the substrate comprises a printed circuit board;

the ball grid array is surface-mounted to a surface of the printed circuit board; and the structural enclosure is attached to the surface of the printed circuit board.

9. A method comprising:

obtaining an electrical component mounted to a substrate;

attaching a structural enclosure to the substrate such that the structural enclosure is positioned around lateral edges of the electrical component, the structural enclosure comprising raised walls extending away from the substrate and surrounding the electrical component, the raised walls configured to block foreign object debris from the electrical component;

placing a thermal interface material over the electrical component;

placing a seal over the structural enclosure; and connecting a lid to the substrate, the lid covering the electrical component and the structural enclosure, the seal being compressed when the lid is connected to the substrate;

wherein the electrical component comprises a semiconductor die and a ball grid array;

wherein the substrate comprises a printed circuit board;

wherein the ball grid array is surface-mounted to a surface of the printed circuit board; and wherein the structural enclosure is attached to the surface of the printed circuit board.

10. The method of claim 9, wherein the structural enclosure, the lid, and the seal retain at least some of the thermal interface material in a space between the electrical component and the lid.

11. The method of claim 9, wherein:

the electrical component further comprises multiple conductive connectors electrically connecting the semiconductor die to the substrate; and the raised walls are configured to block the foreign object debris from at least the conductive connectors of the electrical component.

12. The method of claim 9, wherein the raised walls comprise a groove that receives a portion of the seal.

13. The method of claim 12, wherein each of the raised walls has a non-uniform thickness such that an upper portion of each raised wall is thicker than a lower portion of the raised wall.

14. The method of claim 9, further comprising:

using a material to at least partially fill one or more gaps between the structural enclosure and the substrate.

15. The method of claim 9, wherein the structural enclosure comprises a three-dimensional (3D) printed structure.

16. The method of claim 9, wherein the structural enclosure remains spaced apart from the electrical component and does not contact the electrical component.

17. An apparatus comprising:

a structural enclosure configured to be mounted to a substrate and positioned around lateral edges of an electrical component mounted to the substrate;

wherein the structural enclosure comprises raised walls configured to surround the electrical component, the raised walls configured to block foreign object debris from the electrical component;

wherein the raised walls comprise or are configured to cooperate with a groove configured to receive a portion of a seal; and wherein each of the raised walls has a non-uniform thickness such that an upper portion of each raised wall is thicker than a lower portion of the raised wall.

18. The apparatus of claim 17, wherein the structural enclosure is configured to retain at least some of a thermal interface material in a space between the electrical component and a lid positioned over the structural enclosure and the electrical component.

19. The apparatus of claim 17, wherein:

the substrate comprises a printed circuit board;

the electrical component comprises a semiconductor die and a ball grid array surface-mounted to a surface of the printed circuit board; and the structural enclosure is configured to be attached to the surface of the printed circuit board.

20. The apparatus of claim 17, wherein the structural enclosure comprises a three-dimensional (3D) printed structure.

* * * * *